United States Patent [19]
Hasegawa

[11] Patent Number: 5,640,111
[45] Date of Patent: Jun. 17, 1997

[54] PULSE VOLTAGE DOUBLER CIRCUIT

[75] Inventor: Kazuo Hasegawa, Miyagi-ken, Japan

[73] Assignee: Alps Electric Co., Ltd., Tokyo, Japan

[21] Appl. No.: 610,106

[22] Filed: Feb. 29, 1996

[30]   Foreign Application Priority Data

Mar. 7, 1995   [JP]   Japan ................... 7-047318

[51] Int. Cl.⁶ ................................. H03B 19/14
[52] U.S. Cl. .................... 327/122; 327/306; 327/540
[58] Field of Search ..................... 327/122, 541, 327/543, 540, 306, 178, 179, 530, 534, 331, 333, 315, 356; 368/59, 60; 307/110

[56]              References Cited

U.S. PATENT DOCUMENTS

| | | | |
|---|---|---|---|
| 3,770,327 | 11/1973 | Ruof | 303/21 |
| 4,048,571 | 9/1977 | Jacobson | 328/20 |
| 4,363,067 | 12/1982 | Radomski | 361/91 |
| 4,424,558 | 1/1984 | N'Guyen | 363/124 |

FOREIGN PATENT DOCUMENTS 487386   5/1992   European Pat. Off. ........ H03B 19/14

*Primary Examiner*—Timothy P. Callahan
*Assistant Examiner*—Sanh Nguyen
*Attorney, Agent, or Firm*—Guy W. Shoup; Patrick T. Bever

[57]              ABSTRACT

A pulse voltage doubler circuit for doubling the voltage of output pulses from a microcomputer or the like operating on a low voltage, the doubled output being used on drive a load connected to the microcomputer. The pulse voltage doubler circuit comprises: an inverter circuit having an input terminal, an output terminal, and a first and a second power terminal; a capacitor interconnecting the first and second power terminals of the inverter circuit; and a diode connected interposingly between the first power terminal and a power source. The input terminal of the inverter circuit is connected to the power source, the second power terminal is supplied with an input signal from the microcomputer, and the output terminal is connected to the load which is illustratively an MOSFET gate.

3 Claims, 2 Drawing Sheets

PULSE VOLTAGE DOUBLER CIRCUIT

BACKGROUND OF THE INVENTION

The present invention relates to a pulse voltage doubler circuit and, more particularly, to a pulse voltage doubler circuit adapted to activate MOSFET gates and other parts for driving LED's motors and other loads.

Recent years have seen enhancement type MOSFETs used illustratively as motor drivers and LED drivers. In particular, MOSFETs are used extensively in applications involving direct driving by microcomputer because of their ability to drive heavy loads and because of their high input impedances.

One characteristic of the MOSFET is that it requires a gate voltage of 2 to 4 volts when turned on. Meanwhile, MOSFETs may be desired to be used illustratively in an optical remote controller operating on two 1.5-volt dry batteries. In such a case, the other parts of the optical remote controller need to operate on 1.8 through 3.6 volts, leaving the incorporated MOSFETs devoid of the necessary power for their activation.

Although low voltage type MOSFETs are being marketed today, they still require being fed with a gate voltage of 0.8 to 2 volts in order to be turned on. The low voltage type MOSFETs are vulnerable to static electricity, and their varieties are still limited at present.

As outlined, one disadvantage of enhancement type MOSFETs is that it is difficult for the microcomputer or the like operating on low voltages unfailingly to drive these MOSFETs. This is because the MOSFETs are noted for their low output voltages.

There may be cases in which a conventional voltage doubler circuit and a driver arrangement are combined to drive MOSFETs. However, such setups typical involve an impracticably complicated circuit constitution.

SUMMARY OF THE INVENTION

It is therefore an object of the present invention to provide a pulse voltage doubler circuit having a simplified circuit constitution for doubling the gate driving output pulses supplied by microcomputers or the like, so that the MOSFETs may be driven by the outputs of the microcomputer or like apparatus operating on low voltages.

The above object may be achieved according to one aspect of the present invention, which provides a pulse voltage doubler circuit comprising: an inverter circuit having an input terminal, an output terminal and two power terminals; a capacitor interconnecting the two power terminals of the inverter circuit; and a diode connected interposingly between one of the power terminals and a power source. The input terminal of the inverter circuit is connected to the power source, while the other of the two power terminals is supplied with an input signal.

In the circuit of the above-described constitution, the power supply potential charged into the capacitor when the input signal is Low is added, upon output, to the output signal when the input signal is High. This provides an output signal approximately twice the potential of the power source.

When used in conjunction with a circuit arrangement such as a battery-operated apparatus operating on a low voltage, the inventive circuit can effectively drive MOSFETs and the like having high gate control voltages. The circuit of the invention is also used advantageously in a circuit setup requiring the conversion of interface levels from low-voltage circuits (e.g., 2 V and 3 V circuits) to high-voltage circuits (e.g., 5 V circuits).

Other objects, features and advantages of the present invention will become apparent in the following specification and accompanying drawings.

DESCRIPTION OF THE PREFERRED EMBODIMENTS

Preferred embodiments of the present invention will now be described in detail with reference to the accompanying drawings.

Figure 1:
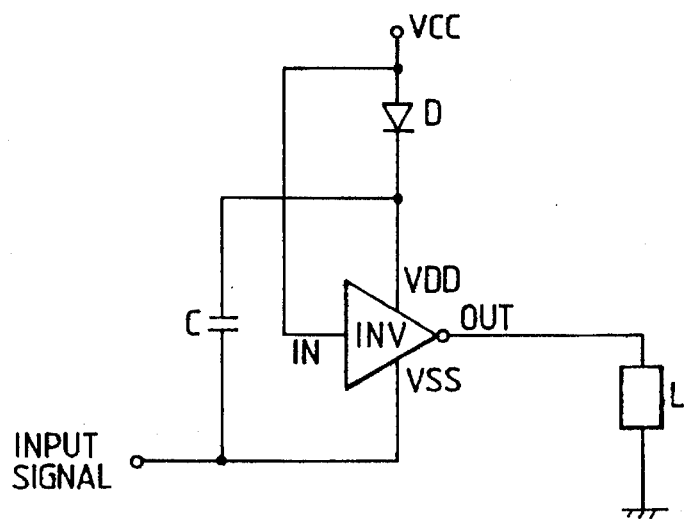
FIG. 1 is a block diagram of a pulse voltage doubler circuit practiced as a first embodiment of the invention.
Figure 2A:
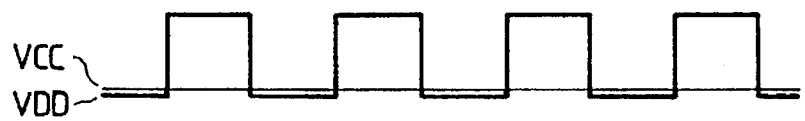
FIG. 2 is a chart of waveforms showing how the circuit of FIG. 1 works.
Figure 2B:
Figure 2C:
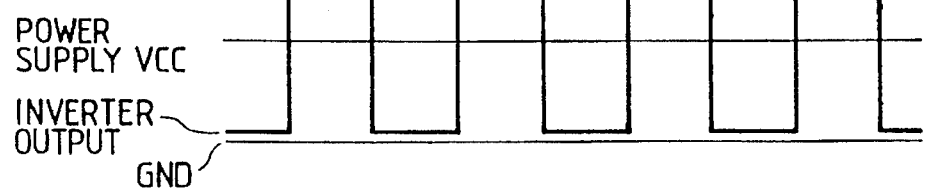

FIG. 1 is a block diagram of a pulse voltage doubler circuit practiced as the first embodiment of the invention, and FIG. 2 is a chart of waveforms showing how the circuit of FIG. 1 works. In FIG. 1, reference characters INV stand for an inverter circuit, C for a capacitor, D for a diode, IN for an input terminal, OUT for an output terminal, VDD and VSS for a first and a second power terminal respectively, VCC for a power source, and L for a load.

As shown in FIG. 1, the first embodiment of the embodiment comprises: the inverter circuit INV having the input terminal IN, output terminal OUT and the first and second power terminals VDD and VSS; the capacitor C interconnecting the first and second power terminals VDD and VSS of the inverter circuit INV; and the diode D connected interposingly between the power source VCC and the first power terminal VDD. The input terminal IN is connected to the power source VCC, while the second power terminal VSS is supplied with an input signal illustratively from the microcomputer. The output terminal OUT is connected to the load L which is illustratively an MOSFET gate. Although the diode D may be of any type, it should preferably be a Schottky barrier diode or the like involving a small forward voltage drop because such a diode can make the most of the power supply voltage.

How the first embodiment works will now be described with reference to the waveform chart of FIG. 2.

It is assumed that the input signal to the indicated circuit is fed from a microcomputer, not shown, whose power source is shared by that circuit. The input signal from the microcomputer constitutes a second power source to the second power terminal VSS of the inverter circuit INV.

Suppose that the input signal is Low. In that case, the potential of the second power terminal VSS of the inverter circuit INV is 0 V (ground level) and the potential of the first power terminal VDD is approximately the same as that of the power source VCC. Here, the input level of the input terminal IN is High as viewed from the inverter circuit INV since the input terminal IN is connected to the first power terminal VDD. It follows that the output level of the output terminal OUT of the inverter circuit INV is Low, i.e., approximately 0 V. While the input signal is being Low, the capacitor C is charged up to the voltage of the first power terminal VDD of the inverter circuit INV (the voltage is represented by reference characters VDD).

Suppose now that the input signal is brought High, replacing the low level of the above state. Because the first embodiment assumes that its input signal comes from the microcomputer sharing the same power source, the high level of the input signal is substantially equal to the potential of the power source VCC and approximately identical to VDD, i.e., the potential of the first power terminal VDD. This also makes the potential of the second power terminal VSS of the inverter circuit INV substantially equal to the potential VDD. Consequently, the potential of the first power terminal VDD of the inverter circuit INV is given as one potential VDD charged in the capacitor C, supplemented by another potential VDD which is the input signal level. This gives rise to a potential level approximately double the initial potential VDD. In this case, the diode D is backward-biased, whereby the potential approximately twice the potential VDD of the first power terminal VDD flows to the power source VCC with no power drop.

Meanwhile, the input level of the input terminal IN of the inverter circuit INV is Low as viewed from the inverter circuit INV since the input terminal IN is connected to the first power terminal VDD. The output level of the output terminal OUT of the inverter circuit INV is thus driven High, approximately twice the potential VDD of the first power terminal VDD.

The above-described first embodiment yields an output signal having a voltage level substantially double the power supply voltage. Thus when used in conjunction with a circuit arrangement such as a battery-operated apparatus operating on a low voltage, the first embodiment can effectively drive MOSFETs and like devices having high gate control voltages.

In addition, the first embodiment of the invention may also be used in a circuit setup requiring the conversion of interface levels from low-voltage circuits (e.g., 2 V and 3 V circuits) to high-voltage circuits (e.g., 5 V circuits). Furthermore, where the load is a piezoelectric buzzer, the first embodiment drives the buzzer at twice its normal sound pressure.

The first embodiment of the invention is designed to change the level of the output signal from 0 V (Low) to double the VDD, i.e., twice the power supply voltage when the input signal is brought High from Low. In some operating circumstances, however, it may be required to change the level of the output signal from −VDD to VDD when the input signal is driven High from Low. This requirement is met by the second embodiment of the invention, which is described below.

Figure 3:
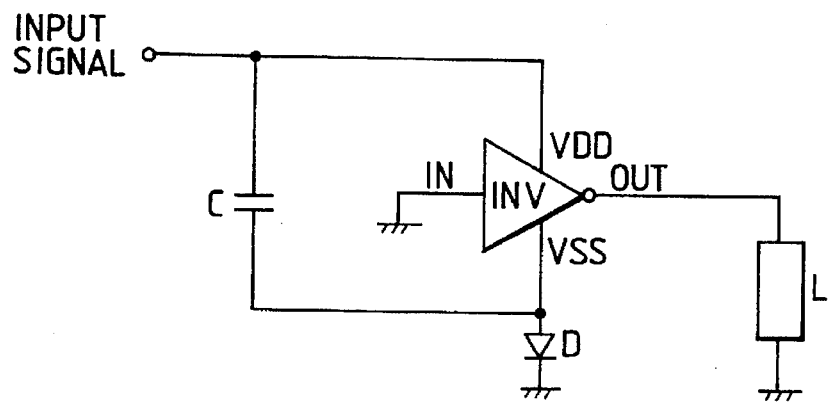
FIG. 3 is a block diagram of a pulse voltage doubler circuit practiced as a second embodiment of the invention.

FIG. 3 is a block diagram of a pulse voltage doubler circuit practiced as the second embodiment. In FIGS. 1 and 3, like reference characters designate like or corresponding parts.

The second embodiment of FIG. 3 is basically the same in operation as the first embodiment. The difference is that the second embodiment has the diode connected interposingly between the second power terminal VSS of the inverter circuit INV and ground GND and has the input terminal IN connected to ground GND, with the input signal being fed to the first power terminal VDD of the inverter circuit INV.

In the circuit setup of FIG. 3, suppose that the level of the input signal from the microcomputer is High and has the potential VDD. Because the input terminal IN of the inverter circuit INV connected to ground GND is at 0 V, the input signal level of the input terminal IN is Low as viewed from the inverter circuit INV. Thus the output level of the output terminal OUT of the inverter circuit INV is High, reflecting the potential VDD of the first power terminal VDD of the inverter circuit INV. While the input signal is being High, the capacitor C is charged up to the voltage VDD of the first power terminal VDD belonging to the inverter circuit INV.

In the setup above, suppose that the input signal level is brought Low (i.e., to 0 V). This is equivalent to the state in which the positive side of the capacitor C is connected to ground GND. As a result, the potential of the second power terminal of the inverter circuit INV reaches −VDD. At this point, the input signal level of the input terminal IN is High as viewed from the inverter circuit INV, while the output level of the output terminal OUT is Low, i.e., the potential −VDD of the second power terminal VSS of the inverter circuit INV.

As described, the second embodiment of the invention changes the output signal level from −VDD to VDD (VDD is the high-level potential of the input signal) when the input signal level is brought High from Low.

Figure 4:
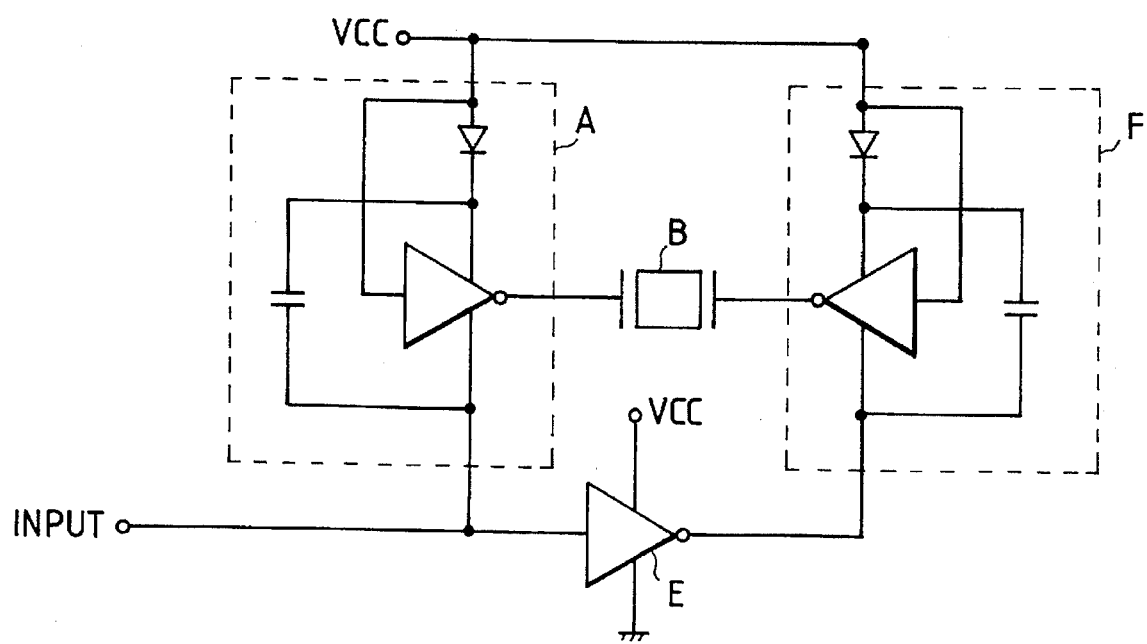
FIG. 4 is a circuit diagram of a pulse voltage quadrupler circuit practiced as a third embodiment of the invention.

FIG. 4 is a circuit diagram of a pulse voltage quadrupler circuit practiced as the third embodiment of the invention. The third embodiment, which is a variation of the first embodiment, provides an output voltage approximately four times the power supply voltage. In FIG. 4, reference characters A and F stand for a pulse voltage doubler circuit each, B for a buzzer, and E for an inverter circuit.

The third embodiment of the invention comprises two pulse voltage doubler circuits A and F that are each identical in constitution to the first embodiment of FIG. 1, and the inverter circuit E for supplying a phase-inverted input signal to the pulse voltage doubler circuit F. As a load, the buzzer B is connected interposingly between the output terminals OUT belonging to the two pulse voltage doubler circuits A and F.

On the one hand, the input signal fed from a microcomputer or the like to drive the buzzer is input direct to the pulse voltage doubler circuit A. On the other hand, the input signal is inverted in phase before being fed to the pulse voltage doubler circuit F. As discussed above with reference to FIG. 1, each of the pulse voltage doubler circuits A and F outputs to the output terminal OUT an output signal having a potential change twice the power supply potential when the input signal is driven High from Low. Since the pulse voltage doubler circuits A and F are supplied with two input signals with their phases 180 degrees apart, the output levels of the output terminals of the circuits A and F are complementary. These two outputs are applied to the two terminals of the buzzer B.

As a result, the voltage applied to the buzzer B is made approximately four times the power supply voltage. This allows the buzzer B as the load of the depicted circuit arrangement to issue an acoustic output at a high sound pressure.

Although it was described above that the input signal from the microcomputer or the like is inverted in phase by the inverter circuit E before being fed to one of the two pulse voltage doubler circuits (i.e., circuit F), this is not limitative of the invention. Alternatively, the two pulse voltage doubler circuits may receive from the microcomputer or like appropriate sources two input signals with their phases suitably inverted relative to each other.

In the third embodiment, only one of the two pulse voltage doubler circuits A and F may be activated selectively. In that case, the voltage fed to the buzzer B is half of what is applied to the setup of FIG. 4. In other words, the third embodiment may be designed to operate selectively in one of two modes. In one mode, the two pulse voltage doubler circuits operate together; in the other mode, only one of the two pulse voltage doubler circuits works. With one of these two modes selected, the buzzer B can provide its sound pressure at one of two levels.

Although the first through the third embodiment of the invention assume MOSFET gates and buzzers as their typical loads to be connected and driven, these are not limitative of the invention. Alternatively, the loads may include any of many other devices. In any case, the present invention is used in a particularly advantageous manner for driving capacitive loads.

As described, the present invention doubles in voltage the pulse signal coming from a microcomputer or like sources. This makes it easy to drive devices such as MOSFETs that need to be activated at relatively high voltage levels. In the case of a circuit arrangement such as a battery-operated apparatus operating on a low voltage, the inventive circuit still allows MOSFETs and the like having high gate control voltages to be operated effectively.

In addition, the invention may be used in a circuit setup requiring the conversion of interface levels from low-voltage circuits (e.g., 2 V and 3 V circuits) to high-voltage circuits (e.g., 5 V circuits). Furthermore, where the load is a piezoelectric buzzer or like device, the invention drives the buzzer at twice its normal sound pressure.

As many apparently different embodiments of this invention may be made without departing from the spirit and scope thereof, it is to be understood that the invention is not limited to the specific embodiments thereof except as defined in the appended claims.

What is claimed is:

1. A pulse voltage doubler circuit comprising:
   an inverter circuit having an input terminal, an output terminal and two power terminals;
   a capacitor interconnecting said two power terminals; and
   a diode connected interposingly between one of said power terminals and a power source;
   wherein said input terminal of said inverter circuit is connected to said power source while the other of said two power terminals is supplied with an input signal.

2. A pulse voltage doubler circuit comprising:
   an inverter circuit having an input terminal, an output terminal and two power terminals;
   a capacitor interconnecting said two power terminals; and
   a diode connected interposingly between one of said two power terminals and ground;
   wherein said input terminal of said inverter circuit is connected to ground while the other of said two power terminals is supplied with an input signal.

3. A pulse voltage quadrupler circuit comprising two pulse voltage doubler circuits according to claim 1, one of said two pulse voltage doubler circuits being supplied with an input signal and the other thereof being fed with a phase-inverted signal derived from the same input signal, wherein a load is connected interposingly between the output terminals of said two pulse voltage doubler circuits.

* * * * *